United States Patent [19]
Caldwell et al.

[11] Patent Number: 5,189,417
[45] Date of Patent: Feb. 23, 1993

[54] DETECTION CIRCUIT FOR MATRIX TOUCH PAD

[75] Inventors: David W. Caldwell; Nicholas W. Medendorp, both of Holland, Mich.

[73] Assignee: Donnelly Corporation, Holland, Mich.

[21] Appl. No.: 598,129

[22] Filed: Oct. 16, 1990

[51] Int. Cl.⁵ .......................................... H03M 11/20
[52] U.S. Cl. ........................................ 341/26; 341/34; 364/189
[58] Field of Search ..................... 341/33, 34, 26, 22, 341/24; 200/600; 400/479.1; 364/189; 379/368

[56] References Cited

U.S. PATENT DOCUMENTS

| | | | |
|---|---|---|---|
| 2,782,308 | 2/1957 | Rug | 331/65 |
| 3,040,178 | 6/1962 | Lyman et al. | 250/213 A |
| 3,200,304 | 8/1965 | Atkins et al. | 361/179 |
| 3,200,305 | 8/1965 | Atkins et al. | 361/179 |
| 3,200,306 | 8/1965 | Atkins et al. | 361/179 |
| 3,254,313 | 5/1966 | Atkins et al. | 331/111 |
| 3,275,897 | 9/1966 | Atkins et al. | 307/228 |
| 3,549,909 | 12/1970 | Adelson | 307/252 |
| 3,641,410 | 2/1972 | Vogelsberg | 318/345 |
| 3,651,391 | 3/1972 | Vogelsberg | 318/446 |
| 3,666,988 | 5/1972 | Bellis | 315/208 |
| 3,798,370 | 3/1974 | Hurst | 178/18 |
| 3,846,791 | 11/1974 | Foster | 341/33 |
| 3,899,713 | 8/1975 | Barkan et al. | 315/34 |
| 3,911,215 | 10/1975 | Hurst et al. | 178/18 |
| 3,965,465 | 6/1976 | Alexander | 340/527 |
| 3,984,757 | 10/1976 | Gott et al. | 323/19 |
| 4,016,453 | 4/1977 | Moennig | 315/312 |
| 4,031,408 | 6/1977 | Holz | 307/116 |
| 4,056,699 | 11/1977 | Jordan | 200/5 A |
| 4,071,689 | 1/1978 | Talmage et al. | 178/18 |
| 4,090,092 | 5/1978 | Serrano | 307/116 |
| 4,101,805 | 7/1978 | Stone | 315/74 |
| 4,101,886 | 7/1978 | Grimes et al. | 340/531 |
| 4,119,864 | 10/1978 | Petrizio | 307/116 |
| 4,123,631 | 10/1978 | Lewis | 200/52 R |
| 4,136,291 | 1/1979 | Waldron | 307/308 |
| 4,145,748 | 3/1979 | Eichelberger et al. | 364/862 |
| 4,152,629 | 5/1979 | Raupp | 315/362 |
| 4,159,473 | 6/1979 | Senk | 340/565 |
| 4,161,766 | 7/1979 | Castleberry et al. | 361/280 |
| 4,174,517 | 11/1979 | Mandel | 340/310 B |
| 4,210,822 | 7/1980 | Wern | 307/116 |
| 4,211,959 | 7/1980 | Deavenport et al. | 315/362 |
| 4,213,061 | 7/1980 | Conner | 307/116 |
| 4,220,815 | 9/1980 | Gibson et al. | 178/18 |
| 4,223,301 | 9/1980 | Grimes et al. | 340/500 |
| 4,237,386 | 12/1980 | Instance | 307/116 |
| 4,264,831 | 4/1981 | Wern | 307/252 H |
| 4,289,972 | 9/1981 | Wern | 307/116 |
| 4,289,980 | 9/1981 | McLaughlin | 307/308 |
| 4,290,052 | 9/1981 | Eichelberger et al. | 340/33 |
| 4,291,303 | 9/1981 | Cutler et al. | 341/26 X |
| 4,293,987 | 10/1981 | Gottbrecht et al. | 29/25.42 |
| 4,304,976 | 12/1981 | Gottbrecht et al. | 219/10.55 B |

(List continued on next page.)

Primary Examiner—Donald J. Yusko
Assistant Examiner—Michael Horabik
Attorney, Agent, or Firm—Price, Heneveld, Cooper, Dewitt & Litton

[57] ABSTRACT

A circuit for detecting user contact of one of a plurality of touch pads includes a plurality of drive lines and a plurality of sense lines coupled with the touch pads. A sense circuit responsive to the signals on the sense lines produces a pulse having a width that is proportional to the amplitude of each of the sense signals. A control circuit measures the width of the pulses produced by the sense circuit and compares each measured pulse width to a reference pulse width to distinguish between a touch and no-touch condition for each touch pad. The sense circuit is illustrated in the form of a comparator having a threshold input that is always exceeded by the sense signal to produce the variable width pulse. Separate amplifiers may be provided for each sense line.

24 Claims, 5 Drawing Sheets

U.S. PATENT DOCUMENTS

| | | | |
|---|---|---|---|
| 4,323,829 | 4/1982 | Witney et al. | 318/55 |
| 4,360,737 | 11/1982 | Leopold | 307/116 |
| 4,374,381 | 2/1983 | Ng et al. | 340/711 |
| 4,380,040 | 4/1983 | Posset | 361/290 |
| 4,394,643 | 7/1983 | Williams | 341/33 |
| 4,400,758 | 8/1983 | Frame | 361/290 |
| 4,405,917 | 9/1983 | Chai | 341/26 |
| 4,405,918 | 9/1983 | Wall et al. | 341/26 |
| 4,413,252 | 11/1983 | Tyler et al. | 341/33 |
| 4,439,647 | 3/1984 | Calandrello et al. | 200/519 |
| 4,476,463 | 10/1984 | Ng et al. | 340/712 |
| 4,493,377 | 1/1985 | Gunther et al. | 173/170 |
| 4,495,485 | 1/1985 | Smith | 341/33 |
| 4,529,968 | 7/1985 | Hilsum et al. | 340/635 |
| 4,535,254 | 8/1985 | Khatri | 307/38 |
| 4,550,310 | 10/1985 | Yamaguchi et al. | 341/33 |
| 4,561,002 | 12/1985 | Chui | 341/26 |
| 4,567,470 | 1/1986 | Yoshikawa et al. | 341/33 |
| 4,584,519 | 4/1986 | Groudis | 323/245 |
| 4,614,937 | 9/1986 | Poujois | 341/33 |
| 4,651,133 | 3/1987 | Ganesan et al. | 341/33 |
| 4,709,228 | 11/1987 | Hucking et al. | 341/26 X |
| 4,731,694 | 3/1988 | Grabner et al. | 361/280 |
| 4,736,190 | 4/1988 | Fiorella | 341/22 |
| 4,740,781 | 4/1988 | Brown | 340/712 |
| 4,743,895 | 5/1988 | Alexander | 340/712 |
| 4,855,550 | 8/1989 | Schultz, Jr. | 200/600 |
| 4,894,493 | 1/1990 | Smith et al. | 200/5 A |
| 4,901,074 | 2/1990 | Sinn et al. | 341/22 |
| 4,920,343 | 4/1990 | Schwartz | 341/33 |

DETECTION CIRCUIT FOR MATRIX TOUCH PAD

BACKGROUND OF THE INVENTION

This invention relates generally to touch detection circuits and, more particularly, to detection circuits for use with a matrix arrangement of touch pads in a keyboard.

It has been known to arrange touch pads in a matrix and to utilize multiplexing techniques in order to reduce the number of interconnections extending between the matrix of touch pads and a detection circuit. For a keypad of sixteen keys, it is necessary to provide four drive lines to apply signals to the matrix and four sense lines to sense the touched and non-touched condition of the sixteen touch pads. One problem with such arrangement is that variations in lead length and touch pad layouts cause variations in the sensed signals received on the sense lines depending upon the individual touch pads being touched.

One solution to this problem is proposed in U.S. Pat. No. 4,145,748 issued to Eichelberger et al. for a SELF-OPTIMIZING TOUCH PAD SENSOR CIRCUIT which converts voltages associated with each of the touch pads into digital values, with the digital reading obtained for the no-touch condition for each touch pad being stored in a memory. A control logic circuit cycles through all touch pads and compares the digital readings obtained from each of the touch pads to the value of the no-touch reading for the respective touch pad which has been stored in the memory. When a significant departure from the no-touch condition is obtained, a touch indication is given for that particular touch pad. The control updates the no-touch digital output in the system memory during an optimization mode. The difficulty with the system disclosed in Eichelberger et al. is that the digital output is produced by a charge transfer analog-to-digital converter which is slow, is relatively expensive and requires specialized control signals from the control logic circuit. Furthermore, all compensation techniques are executed in logic because all signals are sensed through a common analog-to-digital converter.

A hardware-oriented solution to the variation in response from one sense line to another is set forth in U.S. Pat. No. 4,413,252 issued to Tyler et al. for a CAPACITIVE SWITCH AND PANEL. In Tyler et al. capacitive trim tabs are provided for each switch to compensate for differences in stray capacitance from switch to switch. Each of the individual tabs requires trimming to provide the appropriate compensation. This approach is both tedious and time consuming.

SUMMARY OF THE INVENTION

The present invention is embodied in a circuit for detecting user contact of one of a plurality of touch pads including a plurality of drive lines and a plurality of sense lines. Each of the touch pads is coupled to a different combination of the drive and sense lines from any of the other touch pads. A driver circuit means provides pulsed drive signals to each of the drive lines and sense circuit means senses signals produced on each sense line. According to one aspect of the invention, the sense circuit means includes means for producing a pulse having a width that is proportional to the amplitude of each of the sensed signals. Control circuit means measures the width of the pulses produced by the sense circuit means and compares each measured pulse width to a reference pulse width to distinguish between a touch and no-touch condition for each touch pad.

According to another aspect of the invention, a plurality of amplifier means are provided, each of which is connected to one of the sense lines for amplifying the sensed signal on the associated sense line. In this manner, each amplifier may have a gain that is established independently of the other amplifiers so that the gains may be selected to normalize amplifier outputs for touched and no-touched responses to provide a coarse correction for differences in the characteristics of each sense line. A plurality of demodulating means, each responsive to one of the amplifier means, may be provided to produce pulses having widths that are proportional to the amplitude of the associated amplified sense signal. The pulses are provided to a control circuit having an input, measuring means for measuring the width of pulses provided to the input and judging means for comparing each pulse width measurement to a reference pulse width. Multiplexing means may also be provided for selectively connecting each of the demodulating means to the control circuit input means. In this manner, additional hardware correction may be provided in the individual demodulating means in order to reduce the amount of software correction that is required.

In the preferred embodiment, each demodulating means includes a comparator having a reference input to produce pulse having a width that is proportional to the amplitude of the sensed signal. The width of the pulse is measured by a timer input of a microprocessor. These and other objects, advantages and features of this invention will become apparent upon review of the following specification in conjunction with the drawings.

DESCRIPTION OF THE PREFERRED EMBODIMENT

Figure 1:
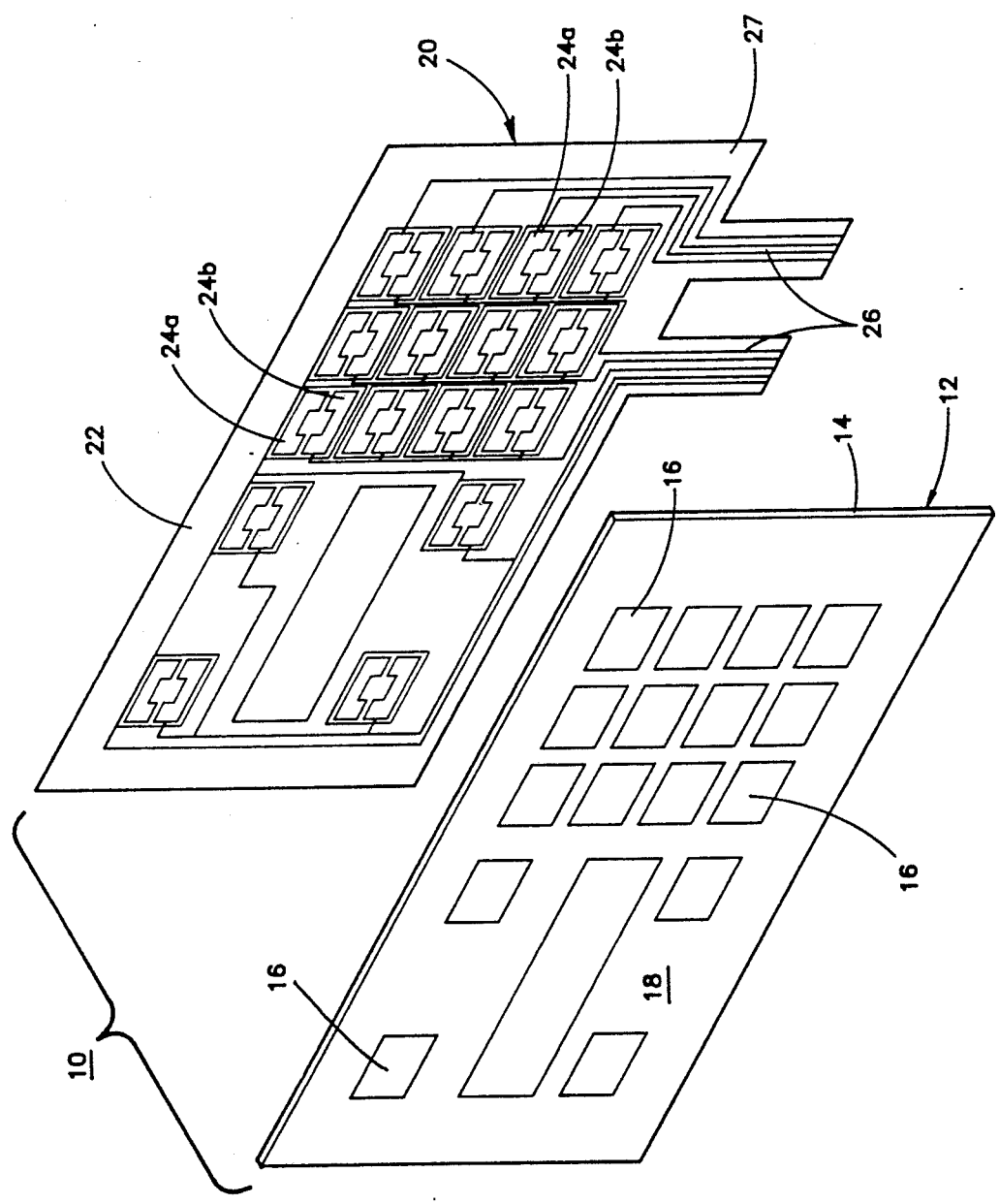
FIG. 1 is a perspective view of a matrix touch pad useful with the present invention.

Referring now specifically to the drawings and the illustrative embodiments depicted therein, a matrix touch pad assembly 10 includes a rigid outer panel 12 including a non-flexible dielectric member 14 and transparent conductive touch pads 16 formed on an outer surface 18 of dielectric member 14 (FIG. 1). Touch pad assembly 10 additionally includes an inner panel 20 having a dielectric member 22, which may be flexible, a plurality of pairs of conductive pads 24a, 24b and conductive leads 26 extending to conductive pads 24a, 24b. Conductive pads 24a, 24b and conductive leads 26 are printed on surface 27 of dielectric member 22 facing dielectric member 14 to which inner panel 20 is attached by an adhesive (not shown). Each touch pad 16 overlies a pair of conductive pads 24a, 24b to define a capacitive switch 28.

Figure 2:
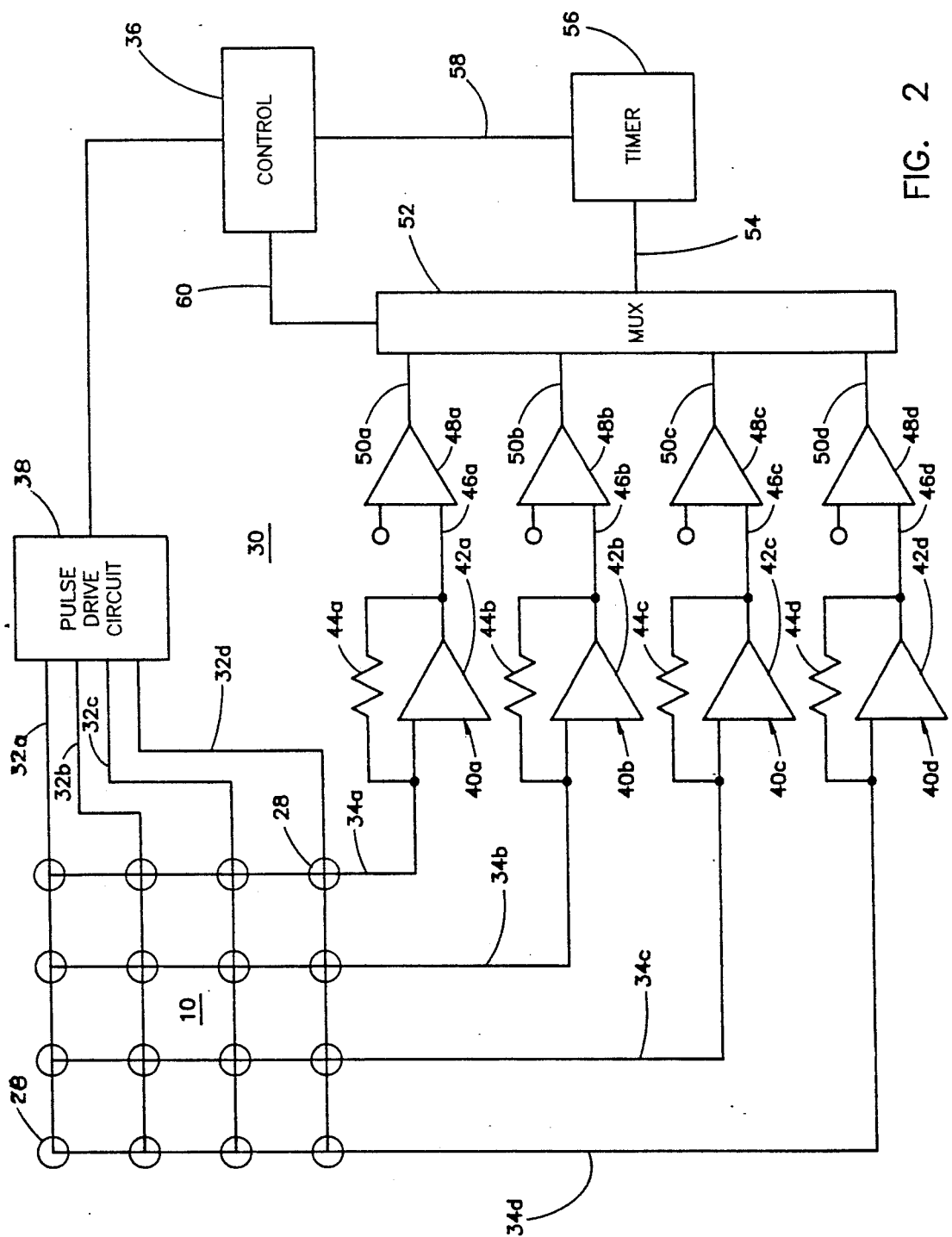
FIG. 2 is a schematic diagram of a detection circuit according to the invention.

Matrix touch pad assembly 10 is interconnected with a detection circuit 30 through conductive leads 26 (FIG. 2). Conductive leads 26 are grouped into drive lines 32a–32d and sense lines 34a–34d. Each touch switch 28 is connected with a different combination of drive lines 32a–32d and sense lines 34a–34d. A control circuit 36, which in the illustrated embodiment is microprocessor controlled, provides timing signals to a pulse drive circuit 38 which produces pulses sequentially on drive lines 32a–32d. As best seen by reference to FIG. 2, a pulse applied to one of drive lines 32a–32d is applied to an entire "row" of capacitive switches 28. Each of sense lines 34a–34d, which is responsive to an entire column of capacitive switches 28, is connected to the input of an amplifier 40a–40d. Each amplifier 40a–40d includes an amplification means, such as an operational amplifier 42a–42d and a gain control means such as a feedback resistor 44a–44d. Each amplifier 40a–40d produces an output on line 46a–46d which is provided to the non-inverting input of a comparator 48a–48d. The inverting input for each comparator 48a–48d is connected to a one of plurality of reference voltage U1–U4. Outputs 50a–50d of comparators 48a–48d are provided as inputs to a demultiplexing circuit, or demultiplexer, 52. Demultiplexer 52 provides an output on a line 54 which is provided as an input to a timer 56, whose output on a line 58 is provided as an input to control 36. Control 36, provides timing signals on a line 60 to demultiplexer 52.

Figure 3A:
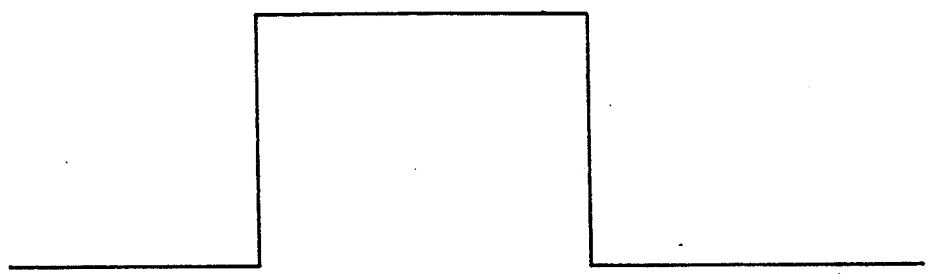
FIGS. 3A through 3D are diagrams illustrating signal wave forms in the circuit illustrated in FIG. 2.
Figure 3B:
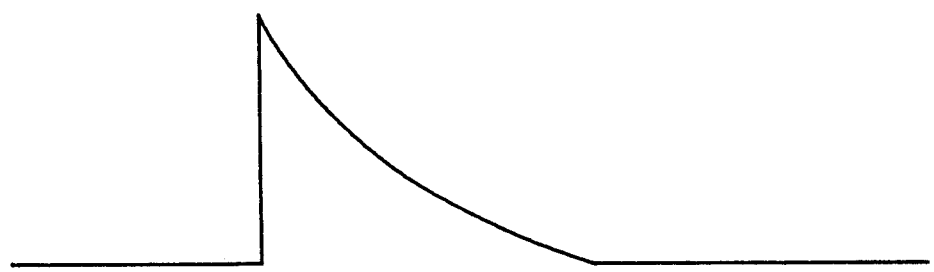
Figure 3C:
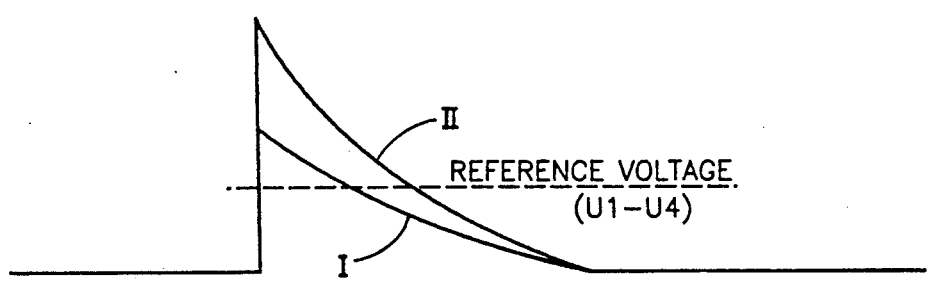
Figure 3D:
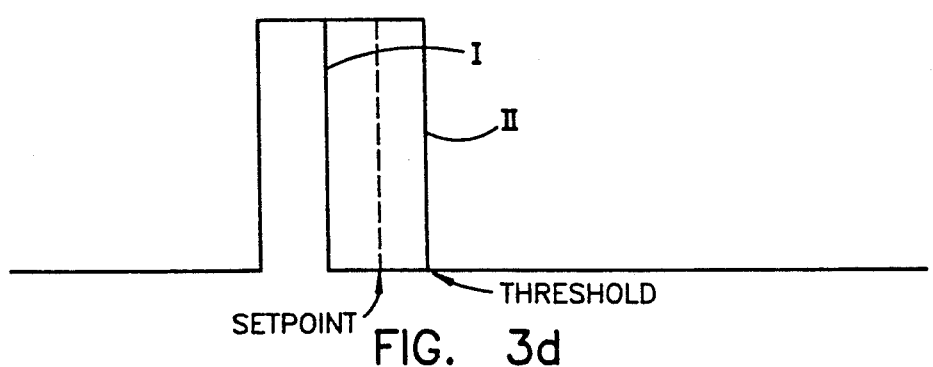

Each time a pulse, having the wave form illustrated in FIG. 3A is produced on one of the drive lines 32a–32d, a differentiated form of the pulse is received on lines 34a–34d, as illustrated in FIG. 3B. After being amplified by amplifiers 40a–40d, each differentiated signal is compared against the associated reference level U1–U4 which are established at values that are less than than peak value of the differentiated signal, as illustrated in FIG. 3C, for both touch and no-touch conditions. The resulting output of comparators 46a–46d are pulses having widths that are proportional to the amount of time that the corresponding differentiated signal is above the level of the associated threshold U1–U4. If a user actuates a capacitive switch 28 by touching the associated conductive touch pad 16, the differentiated signal on lines 34a–34d decreases in amplitude as illustrated by the wave form I in FIG. 3C. Because the attenuated wave form, resulting from the users body forming a path to the ground, has a proportionally lower amplitude throughout the signal, a narrower portion of signal I will be below the threshold. The result is a narrower pulse I (FIG. 3D) provided on the output of the associated comparator 48a–48d. When a particular capacitive switch is not being touched, the wave form of the differentiated signal appears as II in FIG. 3C which results in a wider output pulse II from the associated comparator, as illustrated in FIG. 3D.

Control circuit 36 synchronizes pulse drive circuit 38 and multiplexer 52 such that the output of demultiplexer 52 on line 54 represents sixteen serial pulses whose widths represent the state of the sixteen switches 28. The serial pulses on line 54 are provided to timer 56 which, for each pulse, measures its width and provides a digital signal on line 58 to control 36 representing the width for each pulse. In this manner, control 36 is repetitively provided with information regarding the condition of each capacitive switch 28.

Gain control means 44a–44d for each amplifier 40a–40d is independent of the other gain control means. In this manner, variations in the characteristic responses of sense lines 34a–34d, as a result of lead line length, stray capacitance, variation in the shape of pads 24a, 24b and the like, may be compensated for by providing a gain for each amplifier 40a–40d that provides peak signal amplitudes on lines 46a–46d that are substantially matched for touched and non-touched conditions of all sense lines 34a–34d. This provides a coarse correction to compensate for the variations in stray capacitance, lead line length, pad configuration, and other factors causing variation from one sense line to the next. This may be accomplished either by providing adjustable feedback resistors 44a–44d or by providing fixed resistors having values that are matched to a particular configuration of touch pad assembly 10. Signal strength variations that remain on output lines 46a–46d from amplifiers 40a–40d may be further corrected by selecting individual reference voltage levels U1–U4 for comparators 48a–48d. In this manner, the pulse output of comparators 48a–48d may be made relatively uniform for all comparator outputs for both touched and non-touched conditions. In a preferred embodiment, reference voltage levels U1–U4 are made the same for all sense lines and all coarse corrections are made by suitable selection of the gains for amplifiers 40a–40d.

Figure 4A:
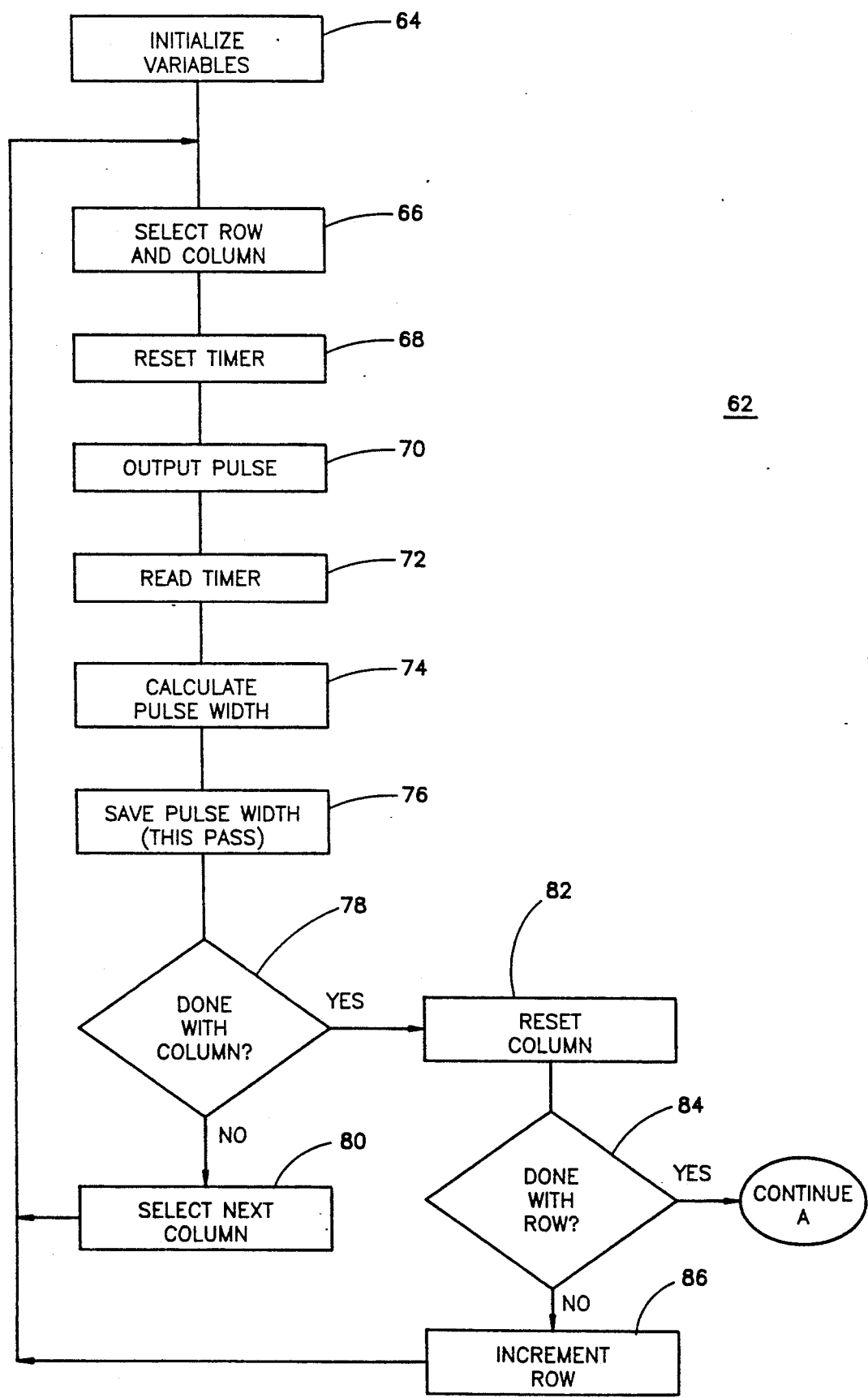
FIGS. 4A and 4B illustrate a flow chart of software useful with the present invention.

Control 36 includes a software program 62 which is initialized at 64 and selects (66) the switch residing at the first row and column and, for the particular row and column, resets timer 56 at 68 (FIG. 4a). The program causes pulse drive circuit 38 to produce an output pulse at 70 on the appropriate one of drive lines 32a–32d. The program additionally causes control 36 to produce the appropriate signals on line 60 for the demultiplexer to select the sense line 50a–50d for the column. Timer 56 is then read (72) and the pulse width is determined (74) from the digital output line 58. This number is stored (76) in a memory location allocated to the particular switch being read during this pass through the program (THIS PASS). Control then passes to 78 and 80 for repetition of the above sequence for all columns in a row and to 82 and 84 for completion of all rows of switches 28 in the matrix.

Figure 4B:
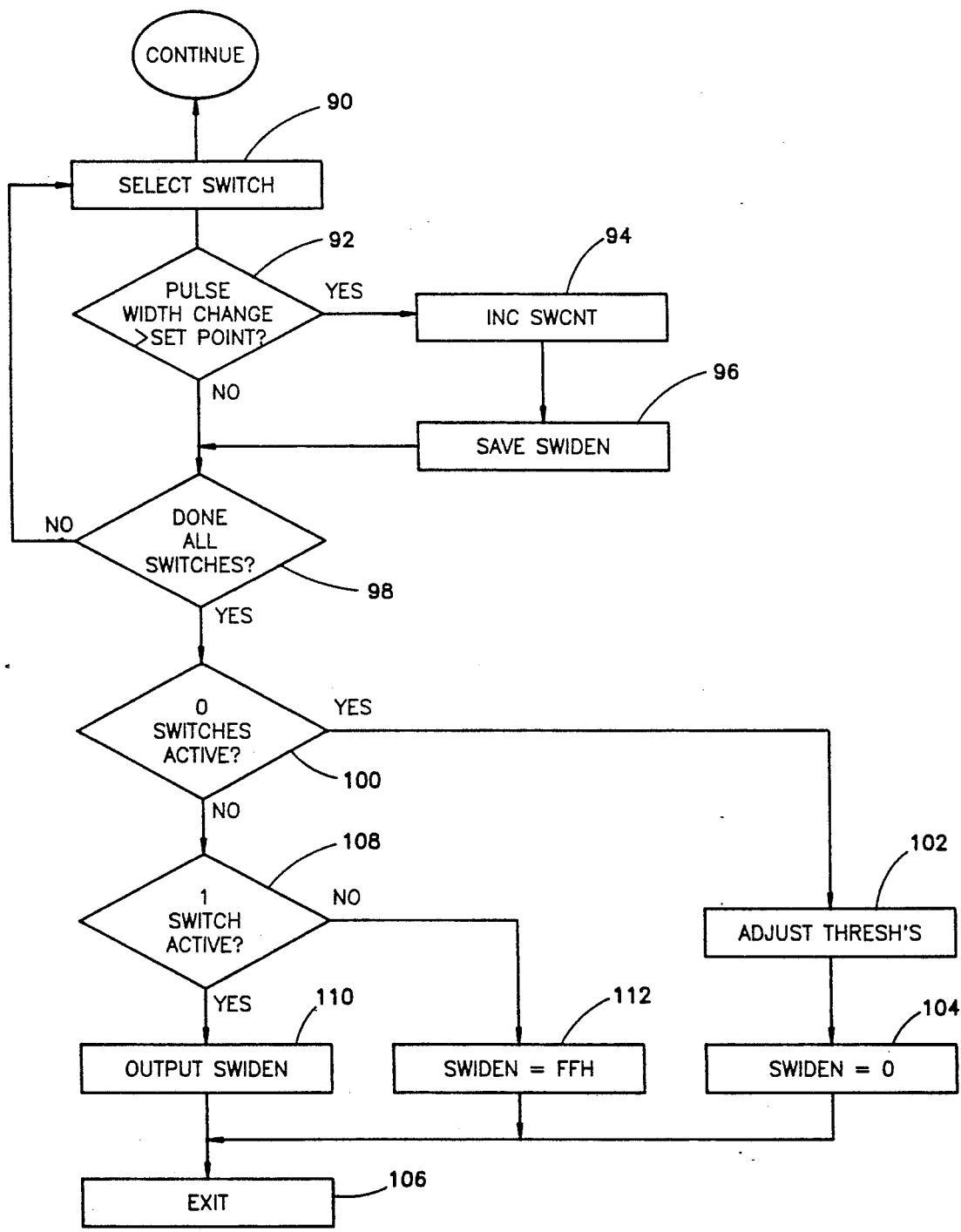

After all switches have been processed, control passes to 90 (FIG. 4B) where the number stored at 76 for the first switch is compared at 92 with another number (THRESHOLD) stored in another memory location allocated to that switch in order to provide judging means for judging whether the switch is active. If it is determined at 92 that the pulse width (THIS PASS) is less than THRESHOLD by a given amount (SET POINT), control passes to 94 where a counter (SWCNT) is incremented and to 96 where the identity of the active switch is stored. If it is determined at 92 that the pulse width for the switch THIS PASS is not less than the THRESHOLD by the given amount (SET POINT), control passes to 98 where it is determined whether there remains any switches to be tested. All switches 28 are examined in this manner.

After all switches 28 are examined, control passes to 100 where it is determined whether any switches are active by examining the content of the SWCNT register. If it is determined at 100 that zero switches are active, control passes to 102 where the values of the THRESHOLD for all of the switches are adjusted according to the most recently determined pulse width values. Control then passes to 104 where the value of a register (SWIDEN) is reset to zero. SWIDEN is a register representing the identity of a switch which becomes active, or touched, and is available as control input for devices (not shown) being controlled by the touch pad assembly. The program is exited at 106. If it is determined at 100 that there is some number of switches greater than zero that are active, control passes to 108 where it is determined whether only one switch is active. If so, control passes to 110 where the identity of the active switch loaded into SWIDEN and is outputted as the output of detection circuit 30. If it is determined at 108 that some number other than one switch is active, control passes to 112 where an error code, such as FFH is loaded into SWIDEN and outputted to indicate that an illegal condition, namely, more than one capacitive switch being actuated at a time, is provided.

Program 62 provides a software adjustment to the value of the thresholds for each switch to compliment the coarse adjustments made by amplifiers 40a–40d and, optionally, by comparators 48a–48d. Because the coarse adjustment is made in hardware, the width of the pulse produced on lines 50a–50d may be made close to the window dictated by the width of the pulses produced by pulse drive circuit 38, without exceeding such window. Furthermore, because the software adjustments are "fine adjustments" there is less opportunity for errors to occur. By individually amplifying each sense line, not only is a coarse adjustment provided, but the supply voltage used to apply pulses by pulse driver circuit 38 may be reduced from 12 volts bipolar to 5–10 volts unipolar. In the illustrated embodiment, the pulses produced by pulse drive circuit 38, and hence the window in which the pulses are measured by timer 56 is 255 microseconds which allows all switches 28 to be monitored approximately every 4 milliseconds.

While the invention is illustrated utilizing comparators in order to demodulate the signal sensed by the sense lines and independently amplified by the amplifiers, other demodulating means are possible. Additionally, the use of comparators, in which the sensed differentiated pulses exceed a threshold in order to produce a pulsed output whose width is proportional to the condition of the switch, may be used in other touch responsive systems, for example, those which multiplex the signals from the sense lines prior to demodulation of the information from the sensed signals. Although timer 56 is illustrated as a separate device, in a preferred embodiment, timer 56 is a timed input of a microprocessor and line 58 is an internal pathway in the microprocessor. Other, changes and modifications to the specifically described embodiments can be carried out without departing from the principles of the invention, which is intended to be limited only by the scope of the appended claims, as interpreted according to the principles of patent law including the Doctrine of Equivalents.

We claim:

1. A circuit for detecting user contact of one of a plurality of touch pads comprising:

a plurality of drive lines and a plurality of sense lines, each of said touch pads being coupled to a difference combination of said drive and sense lines from any other of said touch pads;

driver circuit means for providing pulsed drive signals to said drive lines;

at least one amplifier having an input connected at a given time to one of said sense lines, an output and gain means for establishing the gain of said at least one amplifier; and demodulating means responsive to said at least one amplifier output for determining which of said touch pads is being contacted by a user, wherein said demodulating means includes at least one comparator means responsive at said given time to the amplified sensed signal of said one of said sense lines for producing a pulse having a width that is a function of the time that the associated amplified sensed signal is above a given reference level.

2. The circuit in claim 1 wherein each of said gain means is independent of the other said gain means.

3. The circuit in claim 1 wherein said given reference level is individually selected for each of said demodulating means.

4. The circuit in claim 1 wherein said demodulating means further includes timer means for measuring the length of time that a pulse is present.

5. The circuit in claim 1 wherein said demodulating means further includes means for establishing a reference pulse width associated with each of said touch pads and adjustment means for adaptively adjusting each of said reference pulse widths.

6. A circuit for detecting user contact of one of a plurality of touch pads comprising:

a plurality of drive lines and plurality of sense lines, each of said touch pads being coupled to a different combination of said drive and sense lines from any other of said touch pads;

driver circuit means for providing a pulsed drive signal to each said drive line;

sense circuit means for sensing signals produced on said sense lines, said sense circuit means including means for producing a pulse having a width that is proportional to the amplitude of each sensed signal; and control circuit means for measuring the width of pulses produced by sense circuit means and comparing each width to a reference pulse width.

7. The circuit in claim 6 wherein said sense circuit means includes comparison means for producing pulses having widths that are a function of the time that signals on associated sense lines are above a given reference level.

8. The circuit in claim 6 wherein said sense circuit means includes a plurality of comparator means each responsive to the signal on one of said sense lines for producing a pulse having a width that is a function of the time that the signal on the associated sense line is above a given reference level.

9. The circuit in claim 8 including means for providing an individual reference level for each of said comparator means such that said reference level for each comparator means may be different from that for other comparator means.

10. The circuit in claim 6 wherein said control circuit means includes timer means for measuring the length of time that a pulse is present and means for providing each of said pulses to said timer means such that the width of each pulse may be determined.

11. The circuit in claim 6 wherein said control circuit means includes pulse drive circuit means for causing said drive circuit means to provide said pulses according to a predetermined sequence and multiplexing means for establishing the touch pad associated with each pulse.

12. The circuit in claim 6 wherein said control circuit means includes means for establishing a reference pulse width associated with each of said touch pads and adjustment means for adaptively adjusting each of said reference pulse width.

13. A circuit for detecting user contact of one of a plurality of touch pads comprising:

a plurality of drive lines and a plurality of sense lines, each of said touch pads being coupled to a different combination of said drive and sense lines from any other of said touch pads;

driver circuit means for providing pulsed drive signals to said drive lines;

a plurality of amplifier means each connected with one of said sense lines for amplifying the sensed signal on the associated said sense line;

a plurality of demodulating means each responsive to one of said amplifier means for producing a pulse having a width that is proportional to the amplitude of the associated amplified sensed signal;

control circuit means including an input, measuring means for measuring the width of pulses provided to said input and judging means for comparing each measurement to a reference pulse width; and multiplexing means for selectively connecting each said demodulating means to said control circuit means input.

14. The circuit in claim 13 wherein each said demodulating means includes a comparator means responsive to the associated amplified sensed signal for producing a pulse having a width that is a function of the time that the associated amplified sensed signal is above a given reference level.

15. The circuit in claim 14 wherein said given reference level is individually selected for each of said demodulating means.

16. The circuit in claim 13 wherein each of said amplifying means includes means for establishing its gain independently of the other said amplifying means.

17. The circuit in claim 13 wherein said measuring means includes timer means for measuring the length of time that a pulse is present.

18. The circuit in claim 13 wherein said control circuit means includes means for coordinating said drive circuit means providing said pulses and said demultiplexing means in order to establish the touch pad associated with each pulse.

19. The circuit in claim 13 wherein said judging means includes means for establishing a reference pulse width associated with each of said touch pads and adjustment means for adaptively adjusting each of said reference pulse width.

20. A circuit for detecting user contact of one of a plurality of touch pads comprising:

a plurality of drive lines and a plurality of sense lines, each of said touch pads being coupled to a different combination of said drive and sense lines from any other of said touch pads;

driver circuit means for providing pulsed drive signals to said drive lines;

a plurality of amplifiers, each amplifier having an input connected to one of said sense lines, an output and gain means for establishing the gain of said amplifier;

a plurality of comparators, each comparator having an input connected to the output of one of said amplifiers, an output and means establishing a reference level, wherein said comparator output is in a given state whenever the signal to the input is greater than the reference level for that particular comparator;

a timer adapted to measuring the width of pulses;

multiplexing means for selectively connecting each said comparator output to said timer; and judging means responsive to said timer for determining whether each pulse has a predetermined relationship to a reference pulse width.

21. The circuit in claim 20 wherein said reference level for each of said comparators is independent of the other said reference levels.

22. The circuit in claim 20 wherein each of said gain means is independent of the other gain means.

23. The circuit in claim 20 further including means for coordinating said drive means providing said pulses and said demultiplexing means in order to establish the touch pad associated with each pulse.

24. The circuit in claim 20 wherein said judging means includes means for establishing a reference pulse width associated with each of said touch pads and adjustment means for adaptively adjusting each said reference pulse width.

* * * * *